(12) United States Patent
Yates et al.

(10) Patent No.: US 6,296,982 B1
(45) Date of Patent: Oct. 2, 2001

(54) IMAGING ARTICLES

(75) Inventors: Michael Yates; Carolyn O'Sullivan, both of West Yorkshire (GB); Gerhard Hauck, Badenhausen (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/444,127

(22) Filed: Nov. 19, 1999

(51) Int. Cl.[7] .............................. G03F 7/023; G03F 7/30
(52) U.S. Cl. .................... 430/192; 430/165; 430/191; 430/193; 430/302; 430/326
(58) Field of Search .................... 430/165, 191, 430/192, 326, 193, 502

(56) References Cited

U.S. PATENT DOCUMENTS

| | | | |
|---|---|---|---|
| 2,766,118 | 10/1956 | Sus et al. ................................. 95/7 |
| 2,767,092 | 10/1956 | Schmidt et al. ........................... 95/7 |
| 2,772,972 | 12/1956 | Herrick et al. ........................... 96/33 |
| 2,776,118 | 1/1957 | Davis ....................................... 257/3 |
| 2,859,112 | 11/1958 | Sus et al. ................................ 96/91 |
| 2,907,665 | 10/1959 | Fraher .................................... 106/49 |
| 3,046,110 | 7/1962 | Schmidt et al. .......................... 96/33 |
| 3,046,111 | 7/1962 | Schmidt et al. .......................... 96/33 |
| 3,046,115 | 7/1962 | Schmidt et al. .......................... 96/33 |
| 3,046,118 | 7/1962 | Schmidt et al. .......................... 96/33 |
| 3,046,119 | 7/1962 | Schmidt et al. .......................... 96/33 |
| 3,046,120 | 7/1962 | Schmidt et al. .......................... 96/33 |
| 3,046,121 | 7/1962 | Schmidt et al. .......................... 96/33 |
| 3,046,122 | 7/1962 | Schmidt et al. .......................... 96/33 |
| 3,046,123 | 7/1962 | Schmidt et al. .......................... 96/33 |
| 3,061,430 | 10/1962 | Uhlig et al. ............................. 96/33 |
| 3,102,809 | 9/1963 | Endermann et al. ..................... 96/33 |
| 3,105,465 | 10/1963 | Peters .................................... 122/37 |
| 3,635,709 | 1/1972 | Kobayashi .............................. 96/33 |
| 3,647,443 | 3/1972 | Rauner et al. ........................... 96/33 |
| 3,779,778 | 12/1973 | Smith et al. ............................ 96/115 |
| 3,802,885 | 4/1974 | Lawson et al. .......................... 96/75 |
| 3,969,118 | 7/1976 | Stahlhofen et al. .................. 430/192 |
| 4,308,368 | 12/1981 | Kubo et al. ............................ 525/504 |
| 4,411,978 | * 10/1983 | Laridon et al. ....................... 430/157 |
| 4,504,567 | * 3/1985 | Yamamoto et al. ................... 430/165 |
| 4,708,925 | 11/1987 | Newman ................................ 430/270 |
| 4,840,869 | * 6/1989 | Kita et al. ............................. 430/191 |
| 5,279,922 | * 1/1994 | Adachi et al. ..................... 430/270.1 |
| 5,372,907 | 12/1994 | Haley et al. .......................... 430/157 |
| 5,372,915 | 12/1994 | Haley et al. .......................... 430/302 |
| 5,466,557 | 11/1995 | Haley et al. .......................... 430/278 |
| 5,491,046 | 2/1996 | DeBoer et al. ....................... 430/302 |
| 5,942,368 | * 8/1999 | Akiyama et al. ..................... 430/176 |
| 5,981,135 | * 11/1999 | Koes et al. ........................... 430/165 |

FOREIGN PATENT DOCUMENTS

| 9901796 | 1/1999 | (WO) . |
| 9921715 | 5/1999 | (WO) . |

* cited by examiner

*Primary Examiner*—John S. Chu
(74) *Attorney, Agent, or Firm*—Baker Botts L.L.P.

(57) ABSTRACT

An imagable composition, for example a coating on a lithographic printing plate, comprises a carboxylic acid derivative of a cellulosic polymer and a diazide moiety, and may be imaged in various ways, including by ultra-violet radiation, by infra-red radiation and by heat. The presence of the cellulosic polymer can act to enhance resistance to certain organic liquids and/or to increase operating speed.

21 Claims, No Drawings

IMAGING ARTICLES

FIELD OF THE INVENTION

The present specification relates to articles having imagable coatings, for example precursors for lithographic printing plates or for resist-coated electronic parts, such as printed circuits. The invention relates further to methods of making and of using such articles, and to novel compositions per se.

BACKGROUND OF THE INVENTION

A generally used type of lithographic printing plate precursor (by which we mean a coated printing plate prior to exposure and development) has a radiation sensitive coating applied to an aluminum substrate. A positive working precursor has a radiation sensitive coating, which after imagewise exposure to radiation of a suitable wavelength becomes more soluble in the exposed areas than in the non-exposed areas, in a developer. Only the remaining, image, area of the coating is ink-receptive.

The differentiation between image and non-image areas is made in the exposure process where a film is applied to the printing plate precursor with a vacuum to ensure good contact. The printing plate precursor is then exposed to a radiation source; conventionally this has been a UV radiation source. In the case where a positive printing plate precursor is used, the area of the film that corresponds to the image in the printing plate precursor is opaque so that no light will strike the printing plate precursor, whereas the area on the film that corresponds to the non-image area is clear and permits the transmission of light to the coating which becomes more soluble and is removed on development.

In the manufacture of electronic parts such as printed circuits, after exposure to radiation and development, the resist pattern is used as a mask for forming the patterns onto the underlying electronic elements—for example by etching an underlying copper foil. Due to the high resolution demands and the requirements of high resistance to etching techniques, positive-working systems are widely used. In particular, in the main there have been used alkali developable positive working resists mainly composed of alkali-soluble novolac resins.

The types of electronic parts whose manufacture may use a resist include printed wiring boards (PWBs), thick- and thin-film circuits, comprising passive elements such as resistors, capacitors and inductors; multichip devices (MDCs); and integrated circuits (ICs). These are all classified as printed circuits.

Imagable compositions may also be applied to plastics films in order to form masks. The required pattern is formed on the mask, which is then used as a screen in a later processing step, in forming a pattern on, for example, a printing plate or electronic part precursor.

Common to virtually all commercial applications of positive working systems employing UV radiation over several decades have been compositions comprising alkali soluble phenolic resins and naphthoquinone diazide (NQD) derivatives. The NQD derivatives have been simple NQD compounds used in admixture with resins, or NQD resin esters in which the photoactive NQD moiety has been chemically attached to the resin itself, for example by esterification of the resin with an NQD sulfonyl chloride.

U.S. Pat. No. 3,802,885 describes a UV sensitive positive working printing plate containing a naphthoquinone-(1,2)-diazide-(2)-5-sulphonic acid derivative, the printing life of which is said to be improved by the inclusion of a polymeric carboxylic acid. Polymeric carboxylic acids listed are cellulose acetate hydrogen phthalate, collophony-containing resin, carboxyl group containing styrene-maleic acid copolymer, oil-free alkyd resin, fatty acid-free phthalate resin and poly(vinyl hydrogen phthalate). Example 1 of U.S. Pat. No. 3,802,885 describes a number of compositions each containing a polymeric carboxylic acid, a novolac resin and 2,3,4-trihydroxy benzophenone tris-[naphthoquinone-(1,2)-diazide-(2)-5-sulphonate]. Each such composition was tested as a printing plate coating and found to have an estimated life ("run length") of more than 200,000 copies. A comparison composition without a polymeric carboxylic acid failed after 20 revolutions due to poor adhesion of the image to the plate surface.

The naphthoquinone compounds of U.S. Pat. No. 3,802,885 are known as 215-NQD compounds; the moiety $=O$ is at the 1-position, the moiety $=N_2$ is at the 2-position and the moiety $-SO_2-X$ is at the 5-position (thus, on the adjacent fused ring of the naphthyl group).

Digital and laser imaging technology is now making new demands on coatings. We have devised new positive working heat sensitive systems, to meet the new demands. In one important development described in WO 99/01796 we determined that heat could image coatings containing diazide moieties, without causing lysis of the diazide moieties. Heat can be delivered to the coatings described in WO 99/01796 by conduction, using a heated body such as a stylus, or by charged particle radiation, or, preferably, by means of infrared radiation, the coatings then containing suitable infra-red absorbers.

It would be desirable to increase the operating speed of imagable articles, but this generally results in articles with lower chemical resistance—by which we mean resistance to organic chemicals, notably those typically used in printing processes and in PCB manufacture. Equally, it would be desirable to improve chemical resistance, but this generally results in a reduction in operating speed. In practice a compromise must be reached, and often the compromise is disappointing.

By "operating speed" in this specification we mean the criterion which is alternatively known in the art as "sensitivity"; the question of how much energy is needed to effect imaging, given also the developer conditions and other parameters selected. Thus, when we mention "operating speed" in this specification we are considering this in the context of the entire process of exposure and development. We are not referring only to the matter of how the areas of the composition which are exposed react to that exposure.

It is an object of embodiments of this invention to provide articles with imagable coatings which have improved chemical resistance yet still with good operating speed; or to provide articles with imagable coatings with improved operating speed, yet still with good chemical resistance; or to provide articles with improved operating speed and improved chemical resistance.

SUMMARY OF THE INVENTION

We have devised technology which offers improvement of our systems employing diazide moieties, mentioned above, in both conventional photosensitive and thermal contexts, such that their coatings continue to show good developability, with exposed areas dissolving in aqueous developers and with unexposed areas remaining insoluble in such developers, but wherein the coatings have good chemical resistance and good operating speed.

To our surprise we have found that one particular class of polymeric carboxylic acids are effective in achieving our objectives, in compositions containing diazide moieties.

In accordance with a first aspect of the invention there is provided a film-forming composition comprising a carboxylic acid derivative of a cellulosic polymer, and a diazide moiety, the composition having the property that when provided as a solid coating on a substrate regions which have been exposed to imaging energy dissolve in an aqueous developer and regions which have not been thus exposed are resistant to dissolution in the aqueous developer and in organic liquid.

By "imaging energy" we mean radiation (electromagnetic or charged particle), or heat, or both.

Preferably the remaining unexposed regions are more resistant to organic liquids than the remaining unexposed regions of a corresponding coating treated in the same way but not containing the carboxylic acid derivative of a cellulosic polymer.

We have found that the operating speed of the compositions of the invention is good. Preferably the operating speed is higher than the operating speed of a corresponding coating not containing the carboxylic acid derivative of a cellulosic polymer.

The composition may be a liquid composition, containing a solvent, or a solid composition, for example a coating on a substrate, the solid composition being formed by the evaporation of the solvent from the liquid composition. By "solid" we merely mean non-liquid.

In this specification weight percentages of components are expressed with reference to a solid composition.

The presence of the carboxylic acid derivative of a cellulosic polymer appears to confer upon the compositions improved resistance to certain organic liquids, for example petroleum ethers, alkanediols, for example hexanediol, other glycols, glycol ethers, straight-chain alkanols, for example ethanol, branched alkanols, for example isopropanol and 1-methoxypropan-2-ol, cycloalkanols, for example cyclohexanol, and beta-ketoalkanols, for example diacetone alcohol (ie 4-hydroxy-4-methyl-2-pentanone). When we refer herein to a composition or coating as being resistant to organic liquids we are referring to a composition or coating which is preferably resistant to organic liquids of at least one of these classes (ie petroleum ethers; glycols and glycol ethers; and alkanols). more preferably to organic liquids of at least two of them; and most preferably to organic liquids of all three of them.

The composition may comprise a resin blend having as one resin component a carboxylic acid derivative of a cellulosic polymer.

DETAILED DESCRIPTION OF THE INVENTION

Suitably the carboxylic acid derivative of a cellulosic polymer provides at least 0.25%, more preferably at least 0.5%, still more preferably at least 1%, yet more preferably at least 2%, most preferably at least 5%, and, especially, at least 8%, of the weight of the composition.

Suitably the carboxylic acid derivative of a cellulosic polymer provides up to 50%, preferably up to 30%, more preferably up to 20%, still more preferably up to 16%, and most preferably up to 12%, of the weight of the composition.

Preferably the acid number of the carboxylic acid derivative of the cellulosic polymer is at least 50, more preferably at least 80, most preferably at least 100.

Preferably the acid number of the carboxylic acid derivative of the cellulosic polymer does not exceed 210, and preferably does not exceed 180.

"Acid number" is the number of milligrams of potassium hydroxide needed to neutralize 1 gram of the acidic compound.

Said carboxylic acid derivative of a cellulosic polymer may be a carboxylic acid derivative of a cellulose alkanoate, especially of a cellulose acetate.

The carboxylic acid derivatives of a cellulosic polymer may be reaction products of cellulosic polymers and of carboxylic acids or, especially, of acid anhydrides thereof. The carboxylic acids and acid anhydrides may be defined by the formulae

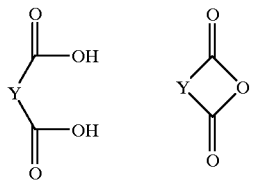

Y is suitably of the formula

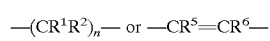

where n represents an integer from 1 to 6, $R^1$ independently represents a hydrogen atom or an alkyl group (and when n is greater than 1 the groups $R^1$ need not be identical with each other), $R^2$ represents a hydrogen atom or an alkyl group (and when is greater than 1 the groups $R^2$ need not be identical with each other), $R^5$ represents a hydrogen atom or an alkyl group, $R^6$ represents a hydrogen atom or an alkyl group, or $R^5$ and $R^6$ together represent a chain such that the group —$CR^5$=$CR^6$— is an optionally substituted aryl or heteroaryl group.

Any alkyl group is suitably a $C_{1-6}$ alkyl group, preferably a $C_{1-4}$ alkyl group, and, most preferably, a methyl group.

An optionally substituted aryl group may be an optionally substituted naphthyl or, especially, an optionally substituted phenyl group (such that the relevant anhydride is phthalic anhydride).

An optionally substituted heteroaryl group may suitably comprise 5 or 6 ring atoms of which 1 or more, preferably 1 or 2, are hetero atoms selected from oxygen, sulphur or nitrogen. Preferred heteroaryl groups have 1 oxygen atom; or 1 sulphur atom; or 1 or 2 nitrogen atoms.

Optional substituents of an aryl or heteroaryl group may suitably be selected from halogen atoms, and from $C_{1-4}$ alkyl, $C_{1-4}$ haloalkyl, cyano, $C_{1-4}$ alkoxy and carboxylic acid groups. There may suitably be 1–3 substituents but preferred aryl or heteroaryl groups are unsubstituted.

Most preferably Y is selected from the following groups:

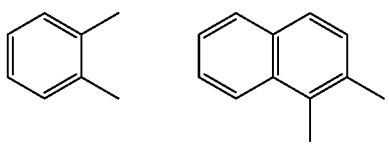

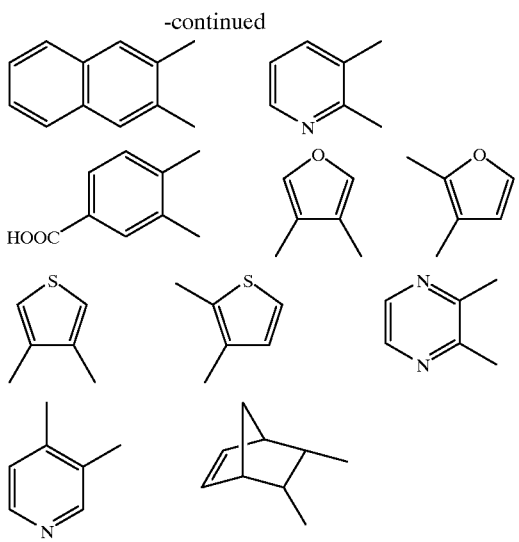

wherein each of $R^1, R^2, R^3, R^4, R^5$ and $R^6$ independently represents a hydrogen atom or an alkyl group.

Particularly preferred carboxylic acid derivatives of a cellulosic polymer are the materials commercially available under the names CAP (cellulose acetate phthalate), CAHP (cellulose acetate hydrogen phthalate—CAS No 9004-38-0) and CAT (cellulose acetate trimellitate—CAS No 52907-01-4). Cellulose acetate propionate (CAS No 9004-39-1) and cellulose acetate butyrate (CAS No 9004-36-8) are also commercially available and may be useful.

In the present invention there is a requirement that the cellulosic polymer has carboxylic acid functionality but it may have further functional groups, for example hydroxyl groups or alkoxy groups, or groups containing an amide functionality.

The diazide moieties used in this invention preferably comprise diazo groups $=N_2$ conjugated to carbonyl groups, preferably via an aromatic or heteroaromatic ring. In such moieties a carbonyl group is preferably bonded to the aromatic or heteroaromatic ring at an adjacent ring position to the diazo group. Preferred moieties are o-benzoquinonediazide (BQD) moieties (often referred to as o-quinonediazides) and o-naphthoquinonediazide (NQD) moieties.

A BQD moiety may, for example, comprise a 1,4- or, preferably 1,2-benzoquinonediazide moiety.

An NQD moiety may, for example, comprise a 1,4-, 2,1- or, most preferably, a 1,2-naphthoquinone diazide moiety.

Generally, NQD moieties are preferred to BQD moieties in the practice of the invention.

Most preferred in the practice of the present invention is a 1,2-naphthoquinonediazide moiety.

The invention requires the use of a composition comprising a diazide moiety. The diazide may be present as a simple compound admixed into the composition or, as is preferred, as a moiety which is covalently bonded as a functional group to a polymer of the composition.

Preferred diazide compounds are sulfonyl compounds in which the group $—SO_2—$ is bonded to an aromatic ring, suitably to the 5— or, especially, to the 4-position of a naphthyl ring. Its other chemical bond may be to a polymer chain—the functionalisation approach—or may be to a ballast moiety such as a hydroxylbenzophenone group, especially 2,4-dihydroxyphenone—the admixture approach.

Examples of preferred naphthoquinone diazide moieties which may be used in the photosensitive composition are disclosed in a variety of publications such as U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,046,123; 3,061,430; 3,102,809; 3,105,465; 3,635,709; and 3,647,443. Among these, preferred are o-naphthoquinonediazido sulfonates or o-naphthoquinonediazido carboxylates of aromatic hydroxyl compounds; o-naphthoquinone diazido sulfonic acid amides or o-naphthoquinonediazido carboxylic acid amides of aromatic amine compounds, for instance, esters of naphthoquinone-1,2-diazido sulfonic acid with polyhydroxyphenyl; esters of naphthoquinone-1,2-diazido-4-sulfonic acid or naphthoquinone-1,2-diazido-5-sulfonic acid with pyrogallol/acetone resins; esters of naphthoquinone-1,2-diazidosulfonic acid with novolac-type phenol/formaldehyde resins or novolac-type cresol/formaldehyde resins; amides of poly(p-aminostyrene) and naphthoquinone-1,2-diazido-4-sulfonic acid or naphthoquinone-1,2-diazido-5-sulfonic acid; esters of poly(p-hydroxystyrene) and naphthoquinone-1,2-diazido-4-sulfonic acid or naphthoquinone-1,2-diazido-5-sulfonic acid; and amides of polymeric amines with naphthoquinone-1,2-diazido-4-sulfonic acid. The term "ester" used herein also includes partial esters.

Preferred compositions contain naphthoquinone diazide moieties of the following structure:

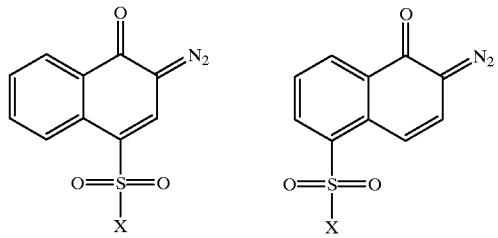

where X is preferably a polymer; but could be a ballast moiety, for example a dihydroxybenzophenone group.

To our surprise we have found in our experimental work to date that in compositions containing 214-NQD moieties the improvements in operating speed and run length are significantly more pronounced than the improvements achieved when 215-NQD moieties are used (those lesser improvements nonetheless being tangible and useful).

Preferably the composition contains, as a further resin component, a polymer having hydroxyl groups. Preferably the further resin component, or the further resin components in total, is/are present in a greater amount by weight than said carboxylic acid derivative of a cellulosic polymer, or of said carboxylic acid derivatives of cellulosic polymers in total. Preferably the composition contains at least 40%, more preferably at least 50%, still more preferably at least 70%, and most preferably at least 80% of such a further resin component, or of such further resin components in total, by weight based on the total weight of the composition.

Particularly useful phenolic resins in this invention are condensation reaction products between appropriate phenols, for example phenol itself, C-alkyl substituted phenols (including cresols, xylenols, p-tert-butyl-phenol, p-phenylphenol and nonyl phenols), diphenols e.g. bisphenol-A (2,2-bis(4-hydroxyphenyl)propane), and appropriate aldehydes, for example formaldehyde, chloral, acetaldehyde and furfuraldehyde and/or ketones, for example acetone. Dependent on the preparation route for the condensation a range of phenolic materials with varying structures and properties can be formed. Particularly useful in this invention are novolac resins, resole resins and novolac/resole resin mixtures. Most preferred are novolac resins. The type of catalyst and the molar ratio of the reactants used in the preparation of phenolic resins determines their molecular structure and therefore the physical properties of the resin. An aldehyde: phenol ratio between 0.5:1 and 1:1, preferably 0.5:1 to 0.8:1 and an acid catalyst is used to prepare novolac resins.

Examples of suitable novolac resins have the following general structure

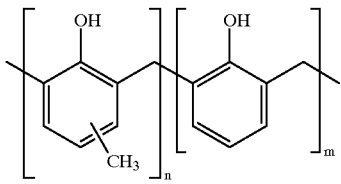

Other polymers suitable for inclusion in the composition, notably in admixture with a phenolic, preferably novolac, resin and the carboxylic acid derivative of a cellulosic polymer, include: a polymer or copolymer of styrene, a polymer or copolymer of hydroxystyrene, notably of 4-hydroxystyrene or 3-methyl-4-hydroxystyrene, a polymer or copolymer of an alkoxystyrene, notably of 4-methoxystyrene, a polymer or copolymer of acrylic acid, a polymer or copolymer of methacrylic acid, a polymer or copolymer of acrylonitrile, a polymer or copolymer of acrylamide, a polymer or copolymer of vinyl alcohol, an acrylate polymer or copolymer, a polymer or copolymer of methacrylamide, a sulphonamido or imido polymer or copolymer, a polymer or copolymer of maleiimide or of alkylmaleiimide or of dialkylmaleiimide, a polymer or copolymer of maleic anhydride (including partially hydrolysed forms), a hydroxycellulose or a carboxycellulose.

Compositions intended for thermal imaging preferably include a compound which absorbs radiation in the wavelength range 600–1400 nm and converts it to heat.

A large number of compounds, or combinations thereof, can be utilized as radiation absorbing compounds in preferred embodiments of the present invention.

The radiation absorbing compound may usefully be a pigment, which is a black body or broad band absorber. It may be carbon such as carbon black or graphite. It may be a commercially available pigment such as Heliogen Green as supplied by BASF or Nigrosine Base NG1 as supplied by NH Laboratories Inc or Milori Blue (C.I. Pigment Blue 27) as supplied by Aldrich.

The radiation absorbing compound may usefully be an infra-red absorbing dye able to absorb the radiation selected for imaging and convert it to beat.

Preferably the infra-red absorbing compound is one whose absorption spectrum is significant at the wavelength output of the laser which is (in preferred embodiments) to be used in the method of the present invention. Usefully it may be an organic pigment or dye such as phthalocyanine pigment. Or it may be a dye or pigment of the squarylium, merocyanine, cyanine, indolizine, pyrylium or metal dithioline classes.

Suitably the radiation absorbing compound, when present, constitutes at least 0.25%, preferably at least 0.5%, more preferably at least 1%, most preferably at least 2%, of the total weight of the coating. Suitably the radiation absorbing compound, when present, constitutes up to 25%, preferably up to 20%, and most preferably up to 15%, of the total weight of the coating. There may be more than one radiation absorbing compound. References herein to the proportion of such compound(s) are to their total content.

In certain compositions of the present invention intended for heat imaging, the heat is believed to produce areas which have transient increased solubility in the developer. After an interval such areas may partially or wholly revert to their original, non-imaged level of solubility. Thus the mode of action of such coatings does not require heat-induced lysis of the modifying means but, more likely, the break-up of a physico-chemical complex, which can re-form. Consequently, in such embodiments the precursor is contacted with a developer within a time period of 20 hours or less of the exposure to imaging heat, preferably within about 120 minutes of exposure, and most preferably within 5 minutes of exposure.

Suitably the composition contains a developer resistance means as defined in WO 99/21725, suitably a siloxane, preferably constituting 1–10 wt % of the composition. Preferred siloxanes are substituted by one or more optionally-substituted alkyl or phenyl groups, and most preferably are phenylalkylsiloxanes and dialkylsiloxanes. Preferred siloxanes have between 10 and 100 —Si($R^1$)($R^2$)O— repeat units. The siloxanes may be copolymerised with ethylene oxide and/or propylene oxide. For further information on preferred siloxanes the definitions in WO 99/21725 may be recited.

The compositions of the invention may contain other ingredients such as stabilising additives, inert colorants, and additional inert polymeric binders as are present in many positive working coatings.

In accordance with a second aspect of the invention there is provided a positive working lithographic printing plate precursor or electronic part precursor or mask precursor having a coating on a substrate, the coating comprising a composition as defined above.

Preferably the coating is laid down from a liquid form of the composition, from which a solvent is removed by evaporation, to form the dried coating.

After provision of the coating on the precursor the precursor may be subjected, as part of its manufacture, to a stabilizing heat treatment step. We favor carrying out the heat treatment at a temperature of at least 40° C., preferably at least 45° C., most preferably at least 50° C. As regards the upper limit, we favor using a temperature not in excess of 90° C., preferably not in excess of 85° C., most preferably not in excess of 60° C. In general, heat treatments in which the maximum temperature does not exceed the glass transition temperature (Tg) of the composition (as measured by differential scanning calorimetry (DSC) at a heating rate of 10° C./minute) are favored. Such heat treatments are suitably carried out on a stack of precursors or on a precursor coil, and so are efficient.

We favor carrying out such a heat treatment for at least 4 hours; and preferably for at least 24 hours and most preferably for at least 48 hours.

Preferably such a heat treatment takes place under conditions which inhibit the removal of water from the precursor, for example by wrapping the precursor (or preferably a stack or coil thereof) in a water impermeable material and/or by using humidity control. For further information on such heat treatments WO 99/21715 can be referred to.

A substrate may comprise a metal layer. Preferred metals include aluminum, zinc, copper and titanium.

A substrate in embodiments of the invention intended as printing plate precursors may be arranged to be non-ink-accepting. Said substrate may have a hydrophilic surface for use in conventional lithographic printing using a fount solution or it may have an ink-repelling surface suitable for use in waterless printing.

For printing applications the substrate may be aluminum which has undergone the usual graining, anodic, and post-anodic treatments well known in the lithographic art for enabling a radiation sensitive composition to be coated thereon and for its surface to function as a printing background. Another substrate which may be used in the present invention in the context of lithography is a plastics material base or a treated paper base as used in the photographic industry. A particularly useful plastics material base is polyethylene terephthalate which has been subbed to render its surface hydrophilic. Also a so-called coated paper which has been corona discharge treated can be used.

Preferred printing plates have a substrate which has a hydrophilic surface and an oleophilic ink-accepting coating.

For electronic part applications the substrate may comprise a copper sheet, for example a copper/plastics laminate. After imaging and development an etching agent may be used to remove exposed metal regions, leaving, for example, a printed circuit.

For certain mask applications the substrate may be a plastics film.

Thus in preferred embodiments a positive working pattern may be obtained after patternwise exposure and development of a precursor of the present invention. The developer solubility of the coating after it has been imaged during patternwise exposure is greater than the solubility of the corresponding unexposed coating. In preferred embodiments this solubility differential is increased by means of additional components and/or by resin modification, as described herein. Preferably such measures reduce the solubility of the polymeric composition, prior to the patternwise exposure. On subsequent patternwise exposure the exposed areas of the coating are rendered more soluble in the developer, than the unexposed areas. Therefore on patternwise exposure there is a change in the solubility differential of the unexposed coating and of the exposed coating. Thus in the exposed areas the coating is dissolved, to form the pattern.

The developer is dependent on the nature of the coating, but is preferably an aqueous developer. Common components of aqueous developers are surfactants, chelating agents such as salts of ethylenediamine tetraacetic acid, organic solvents such as benzyl alcohol and phenoxy ethanol, phosphates, and alkaline components such as inorganic metasilicates, hydroxides and bicarbonates, and mixtures of the foregoing.

Suitably the polymeric material per se used in the film-forming composition of the invention is inherently soluble in an alkaline developer. Suitably it is rendered insoluble in an alkaline developer by means of one or more insolubilizer(s). Preferably, in use, it is more soluble in an alkaline developer that it is in neutral liquids, such as water. Certain useful compositions are substantially insoluble in neutral liquids, such as water.

Preferably an aqueous developer is an alkaline developer containing one or more inorganic or organic metasilicates.

In the specification when we state that a coating is developer soluble we mean that it is soluble in a selected developer, to an extent useful in a practical development process.

When we state that a coating is developer insoluble we mean that it is not soluble in the selected developer, to an extent useful in a practical development process.

In accordance with a third aspect of the invention there is provided a method of preparing a printing plate, mask or electronic part from a positive working printing plate, mask or electronic part precursor, the printing plate, mask or electronic part precursor comprising (a) substrate; and (b) a coating on the substrate, wherein the coating comprises a composition of the first aspect of the invention, the method comprising the steps of, (i) exposing portions of the coating to imaging energy; and (ii) removing the exposed portions of the coating using a developer liquid.

The imaging of selected portions may be effected by heat. In such embodiments exposure is preferably effected by the use of infra-red electromagnetic radiation, the coating preferably containing a radiation absorbing compound as defined above, or a radiation absorbing compound being provided as a separate layer. In preferred thermal methods the electromagnetic radiation employed for exposure is of wavelength at least 650 nm, preferably at least 700 nm, and more preferably at least 750 nm. Most preferably it is at least 800 mn. Suitably the radiation is of wavelength not more than 1350 nm, preferably not more than 1300 nm, more preferably not more than 1200 nm, and most preferably not more than 1150 nm. The radiation may be delivered by a laser under digital control. Examples of lasers which can be used to expose coatings suitable for the method of the present invention include semiconductor diode lasers emitting at between 600 nm and 1400 nm, especially between 700 nm and 1200 nm. One example is the Nd YAG laser which emits at 1064 nm and another is the diode laser used in the Creo Trendsetter thermal image setter, which emits at 830 nm, but any laser of sufficient imaging power and whose radiation is absorbed by the coating to produce heat, can be used. Alternatively charged particle radiation could be used to deliver heat. Alternatively heat could be delivered directly, by a heated body applied to the coating or to the reverse face of the substrate. In this case no radiation absorbing compound is needed Preferably, however, the imaging of selected areas is effected by ultra-violet radiation preferably of wavelength in the range which is believed causes the photolysis of the diazide compound. This is believed to lead to the solubility change by several related mechanisms, including the generation of an acidic decomposition product, believed to be an indene carboxylic acid. The wavelength of the ultra-violet radiation is preferably in the range 200–475 nm, preferably 300–450 nm. It may be delivered by a mercury lamp, as is conventional.

In accordance with a fourth aspect of the invention there is provided an article bearing a pattern in a coating thereon, produced by the method of the third aspect. The article may be a mask or an electronic part but is preferably a printing plate, ready for printing. If wished such a printing plate may undergo a baking step after its chemical development for increased run length but this is not needed for most printing applications.

In accordance with a fifth aspect of the invention there is provided a film-forming composition comprising a carboxylic acid derivative of a cellulosic polymer, and a diazide moiety, the composition having the property that when provided as a solid coating on a substrate regions which have been exposed to imaging energy dissolve in an aqueous developer and regions which have not been thus exposed are resistant to dissolution in the aqueous developer; wherein the composition when provided as a coating on a substrate is more resistant to dissolution in an organic liquid than a corresponding composition not containing a carboxylic acid derivative of a cellulosic polymer.

In accordance with a sixth aspect of the invention there is provided a film-forming composition comprising a carboxylic acid derivative of a cellulosic polymer, and a diazide moiety, the composition having the property that when provided as a solid coating on a substrate regions which have been exposed to imaging energy dissolve in an aqueous developer and regions which have not been thus exposed are resistant to dissolution in the aqueous developer, wherein the composition when provided as a solid coating on a substrate has a higher operating speed than a corresponding composition not containing a carboxylic acid derivative of a cellulosic polymer.

In accordance with a seventh aspect of the invention there is provided a method of preparing a printing plate or electronic part or mask from a positive working printing plate, electronic part or mask precursor, the printing plate, electronic part or mask precursor comprising
- (a) a substrate; and
- (b) an imagable coating on the substrate, wherein the coating comprises a carboxylic acid derivative of a cellulosic polymer, and a diazide moiety; the methods comprising the steps of
  - (i) exposing the coating imagewise; and
  - (ii) removing the exposed portions of the coating using a developer liquid;
    wherein the coating is more resistant to dissolution in an organic liquid than a corresponding composition not containing a carboxylic acid derivative of a cellulosic polymer.

In accordance with an eighth aspect of the invention there is provided a method of preparing a printing plate or electronic part or mask from a positive working printing plate, electronic part or mask precursor, the printing plate, electronic part or mask precursor comprising
- a) a substrate; and
- b) an imagable coating on the substrate, wherein the coating comprises a carboxylic acid derivative of a cellulosic polymer, and a diazide moiety; the methods comprising the steps of
  - i) exposing the coating imagewise; and
  - ii) removing the exposed portions of the coating using a developer liquid;
    wherein the coating is more resistant to dissolution in an organic liquid than a corresponding composition not containing a carboxylic acid derivative of a cellulosic polymer.

In accordance with a ninth aspect of the invention there is provided a film-forming composition comprising a carboxylic acid derivative of a cellulosic polymer and a moiety decomposable by ultraviolet radiation, the composition having the property that when provided as a solid coating on a substrate regions which have been exposed to imaging energy dissolve in an aqueous developer and regions which have not been thus exposed are resistant to dissolution in the aqueous developer and in an organic liquid.

In accordance with a tenth aspect of the invention there is provided a method of preparing a printing plate or electronic part or mask from a positive working printing plate, electronic part or mask precursor which comprises
- (a) a substrate; and
- (b) an imagable coating on the substrate, the coating comprising a carboxylic acid derivative of a cellulosic polymer and a moiety decomposable by ultra-violet radiation;
  the method comprising the steps of
  - (i) exposing the coating imagewise to ultra-violet radiation; and
  - (ii) removing the exposed portions of the coating using a developer liquid.

In accordance wit the eleventh aspect of the invention there is provided a method of preparing a printing plate or electronic part or mask from a positive working printing plate, electronic part or mask precursor which comprises
- (a) a substrate; and
- (b) an imagable coating on the substrate, wherein the coating comprises a carboxylic acid derivative of a cellulosic polymer, and a diazide moiety;
  the method comprising the steps of
  - (i) exposing the coating imagewise; and
  - (ii) removing the exposed portions of the coating using a developer liquid;
    wherein the coating is more resistant to dissolution in an organic liquid than a corresponding composition not containing a carboxylic acid derivative of a cellulosic polymer.

In accordance with the twelfth aspect of the invention there is provided a method of preparing a printing plate or electronic part or mask from a positive working printing plate, electronic part or mask precursor which comprises
- (a) a substrate; and
- (b) an imagable coating on the substrate, the coating comprising a carboxylic acid derivative of a cellulosic polymer and a moiety decomposable by ultra-violet radiation;
  the method comprising the steps of
  - (i) exposing the coating imagewise to ultra-violet radiation; and
  - (ii) removing the exposed portions of the coating using a developer liquid;
    wherein the composition when provided as a coating on a substrate is more resistant to dissolution in an organic liquid than a corresponding composition not containing a carboxylic acid derivative of a cellulosic polymer.

In accordance with the thirteenth aspect of the invention there is provided a method of preparing a printing plate or electronic part or mask from a positive working printing plate, electronic part or mask precursor which comprises
- (a) a substrate; and
- (b) an imagable coating on the substrate, the coating comprising a carboxylic acid derivative of a cellulosic polymer and a moiety decomposable by ultra-violet radiation;
  the method comprising the steps of
  - (i) exposing the coating imagewise to ultra-violet radiation; and
  - (ii) removing the exposed portions of the coating using a developer liquid;
    wherein the composition when provided as a solid coating on a substrate has a higher operating speed than a corresponding composition not containing a carboxylic acid derivative of a cellulosic polymer. dissolution in an organic liquid than a corresponding composition not containing a carboxylic acid derivative of a cellulosic polymer.

The content of WO 99/01796, mentioned above, is hereby incorporated by reference.

A said compound decomposable by ultra-violet radiation may suitably be a latent Bronsted acid.

The term "latent Bronsted acid" refers to a precursor which forms a Bronsted acid by decomposition. Examples of Bronsted acids which are suitable for this purpose are trifluoromethane sulphonic acid and hexafluorophosphoric acid.

The present invention is applicable to the systems described in U.S. Pat. No. 5,491,046, incorporated herein by reference, whose heat sensitive compositions comprise latent Bronsted acids. These are negative working and positive working; the latter being of most interest in the context of the present invention.

Ionic latent Bronsted acids are suitable. Examples of these include onium salts, in particular iodonium, bromonium, chloronium, oxysulfonium, sulfoxonium, telluronium, sulfonium, phosphonium, selenonium, diazonium and arsonium salts. Specific examples of particularly useful onium salts include: diphenyliodonium hexafluorophosphate, triphenylsulfonium hexafluoroantimonate, phenylmethyl-orthocyanobenzylsulfonium trifluoromethane sulfonate, and 2-methoxy-4-aminophenyl diazonium hexafluorophosphate.

Non-ionic latent Bronsted acids are also suitable. Examples of these include compounds of the formula:

$R^3CH_2X$ $R^3CHX_2$ $R^3CX_3$ $R^3(CH_2X)_2$ and $R^3(CH_2X)_3$ wherein X is Cl, Br, F, or $CF_2SO_3$ and $R^3$ is an aromatic group, an aliphatic group or a combination of aromatic and aliphatic groups.

Useful ionic latent Bronsted acids include those represented by the formula:

$Y^+R^4R^5R^6R^7W^-$

When Y is iodine then $R^6$ and $R^7$ are electron lone pairs and $R^4$ and $R^5$ are aryl or substituted aryl groups. When Y is S or Se then $R^7$ is an electron lone pair and $R^4$, $R^5$ and $R^6$ can be an aryl group, a substituted aryl group, an aliphatic group or a substituted aliphatic group. When Y is P or As, then $R^7$ can be an aryl group, a substituted aryl group, an aliphatic group or a substituted aliphatic group. W can be $BF_4$, $CF_3SO_3$, $SbF_6$, $CCl_3CO_2$, $ClO_4$, $AsF_6$, $PF_6$, or any corresponding acid whose pH is less than three.

Any of the onium salts described in U.S. Pat. No. 4,708,925, incorporated herein by reference, can be utilized as the latent Bronsted acid.

An additional class of useful latent Bronsted acids are the haloalkyl-substituted s-triazines. The haloalkyl-substituted s-triazines are well known photolytic acid generators. Use of these compounds for this purpose is described, for example, in U.S. Pat. No. 3,779,778, incorporated herein by reference.

Useful compounds are also described in U.S. Pat. Nos. 5,466,557, 5,372,915 and 5,372,907, related to U.S. Pat. No. 5,491,046 and likewise incorporated herein by reference. We also believe the present invention to be applicable to the phenolic resin systems described in U.S. Pat. No. 4,708,925, comprising an onium salt.

The following examples more particularly serve to illustrate the present invention described hereinabove.

MATERIALS

The following materials are referred to in these examples:

LB744: Rutaphen LB744 cresylic novolac resin, from Bakelite, Germany, having the structure:

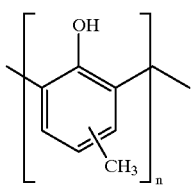

214 NW744: A 214-naphthoquinone diazide-resin ester, made using the procedure described below.

215 NW744: A 215-naphthoquinone diazide-resin ester, made using the procedure described below.

To prepare 214 NW744, LB744 (100 g) was reacted with 214NQD chloride (18 g) by the process outlined hereinafter.

To prepare 215 NW744, LB744 (100 g) was reacted with 215NQD chloride (18 g) by the process outlined hereinafter.

214-NQD chloride and 215-NQD chloride are as drawn above, but wherein the moiety X is chloro.

The resins were modified by simple reaction with the acid chloride, in the following manner:

1. Dissolve 25.0 g of the phenolic resin in 61.8 g of 2-methoxyethanol.
2. Immerse in a 3-necked 500 ml round bottomed flask in a water bath placed on a hot plate stirrer. Attach a stirrer gland, stirring rod and a thermometer to the flask.
3. Place the resin solution into the flask and begin rapid sting.
4. Slowly add 25.6 g of distilled water dropwise keeping precipitation to a minimum.
5. Add sodium hydrogen carbonate (4.3 g) to the flask. Not all of the solid will dissolve.
6. Slowly add the desired acid chloride with vigorous stirring.
7. Warm the reaction mixture and maintain it for 6 hours at 40° C. with stirring.
8. After 6 hours, remove the flask from the water bath and allow to cool (about 30 minutes).
9. Prepare a dilute solution by adding 8.6 g 1.18 s.g. hydrochloric acid to 354 g of distilled water.
10. Slowly precipitate the esterified resin dropwise into the dilute acid with stirring.
11. Filter and wash the precipitate by re-slurrying in distilled water at least three times, if possible until the pH of the filtrate reaches 6.0. In practice, it may only reach 5.5.
12. Dry the precipitate in a vacuum oven at 40° C.

RP2: A 214-NQD novolac resin ester from P.C.A.S., Longumeau, France

PD-140A: A novolac resin from Borden Chemicals, Ohio, USA

"Triazine": 2-(4-methylthiophenyl)-4,6-bis(trichloromethyl)-1,3,5-triazine

DHBP: the prioduct DHBP 85%, a 215-naphthoquinone diazide, a simple ester with dihydroxybenzophenone, from P.C.A.S.

CAHP: Cellulose Acetate Hydrogen Phthalate, from Aldrich Chemical Company, Gillingham, UK.

Ethyl violet: A dye from Aldrich Chemical Company, Gillingham, UK, having the structure

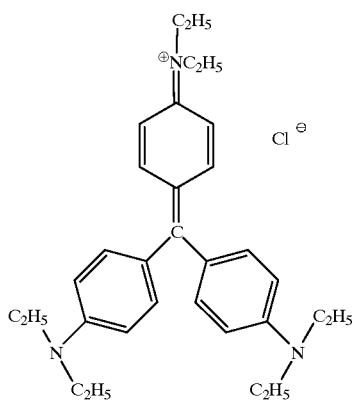

SUBSTRATE

A 0.3 mm thickness sheet of aluminum that has been hydrochloric acid electrograined and anodized and post-anodically treated with an aqueous solution of an inorganic phosphate.

COATING FORMULATIONS

The proportions of (resin+NQD) components are set to 100 wt % –resin wt % and NQD wt % (if present) therefore total 100 wt %. The term "owr" means "on weight of (resin+NQD)". All percentages are expressed with reference to weight of dry film.

Formulation concentrations were selected to provide a dry film weight of approximately 1.7 gm$^{-2}$.

All formulations were coated onto the substrate by means of a wire wound bar.

All coated plates were dried for 80 seconds at 130° C. in a MATHIS LABDRYER oven (as supplied by Werner Mathis AG, Switzerland).

TESTS

Operating speed: Plates were imagewise exposed on a MONTAKOP NOVA ultra-violet lightframe (as supplied by Siegfried Theimer Grafische Gerate GmbH, Birstein, Germany), having a mercury halide diazo bulb, with a STOUFFER control step wedge (as supplied by Kodak Polychrome Graphics) and then developed with GOLD-STAR Positive Developer (as supplied by Kodak Polychrome Graphics) at 20° C. for 1 minute. The number of light units to give a clear 3 STOUFFER step were calculated.

FOUNT RESISTANCE

Plates were prepared with strips of exposed areas to 10, 20, 30, 40, 50, 60, 70, 80, 90 and 100% of the exposure required to show a clear 3 on the STOUFFER wedge when processed as above. A strip of unexposed plate was also included. The plates were then immersed in a fount solution at 25° C. for 1 hour. The fount solution was prepared by mixing 165 g propan-2-ol with 44 g COMBIFIX XL and diluting to 1000 ml with water. The plates were then rinsed with water, dried and TESA 4122 adhesive tape applied to half of each strip. The tape was then removed in one sharp movement to remove loose coating The degree of attack was then observed and a visual assessment of the degree of attack was made, compared with a reference plate.

COMBIFIX XL is a standard fount solution additive available from Horstmann-Steinberg of Germany. It comprises surfactants and printers add it, and similar products, to fount solutions in order to keep the substrate ink free, to soften the water and to aid ink dispersion over the plate surface.

EXAMPLE 1 (COMPARATIVE)

The following solutions were prepared:
40% wt % solution of 214 NW744 in 1-methoxypropan-2-ol
8.86 wt % solution of ethyl violet in 1-methoxypropan-2-ol These were combined and coated to give a coating with a dry film composition of 100 wt % 214 NW744+1.5% owr ethyl violet.

EXAMPLE 2

A 5 wt % solution of CAHP in 1-methoxypropan-2-ol was prepared.

A coating was prepared using this solution mixed with those shown in Example 1 to give a dry film weight of 100 wt % 214 NW744+1.5% owr ethyl violet+5% owr CAHP.

EXAMPLE 3 (COMPARATIVE)

A 40 wt % solution of 215 NW744 in 1-methoxypropan-2-ol was prepared.

A coating was prepared as in Example 1 but substituting the 214 NW744 with 215 NW744.

EXAMPLE 4

A coating was prepared as in Example 2 but substituting the 214 NW744 with 215 NW744.

EXAMPLE 5 (COMPARATIVE)

The following solutions were prepared:
A 20 wt % solution of DHBP in dimethylformamide.
A 30 wt % solution of LB744 in 1-methoxypropan-2-ol.
A coating was prepared using these solutions and the ethyl violet solution described in Example 1 to give a dry film composition of 20 wt % DHBP+80 wt % LB744+1.5% owr ethyl violet.

EXAMPLE 6

A coating was prepared using solutions described above to give a dry film composition of 20 wt % DHBP+80 wt % LB744+1.5% owr ethyl violet+5% owr CAHP.

RESULTS FOR EXAMPLES 1 TO 6

The following results were obtained:

| Example | Operating speed - light units to yield clear 3 STOUFFER step | Fount resistance - degree of attack |
| --- | --- | --- |
| 1 | 283 | No attack on unexposed and 10% exposed strips. Severe attack on remaining exposed strips. |
| 2 | 228 | No attack on unexposed, 10% and 20% exposed strips. |

-continued

| Example | Operating speed - light units to yield clear 3 STOUFFER step | Fount resistance - degree of attack |
|---|---|---|
| 3 | 322 | Slight attack on remaining exposed strips. No attack on unexposed and 10% exposed strip. |
| 4 | 228 | Severe attack on remaining exposed strips. No attack on unexposed and 10% exposed strips. Slight attack on 20% and 30% exposed strips. |
| 5 | 228 | Severe attack on remaining exposed strips No attack on unexposed and 10% exposed strips. |
| 6 | 128 | Severe attack on remaining exposed strips. No attack on unexposed and 10% exposed strips. Slight attack on 20% exposed strip. Significant attack on remaining exposed strips. |

CONCLUSIONS ON EXAMPLES 1 TO 6

In all examples containing CAHP (Examples 2, 4 and 6) the operating speed of the plate is faster than the corresponding example without CAHP (Examples 1, 3 and 5), whilst at least retaining fount resistance. In the cases of Examples 2 and 4, the fount resistance is improved, very substantially in the case of Example 2. In none of the examples was there any significant fount attack in unexposed areas. None of the samples was subjected to significant ambient light levels. Based on the above results and of our experience we would expect samples which had been subjected to significant ambient light levels to undergo some fogging and to have reduced fount resistance in non-imaged regions. The above results indicate that the presence of the CAHP can be expected to counter this effect and facilitate handling of precursors, prior to imaging.

EXAMPLE 7 (COMPARATIVE)

The following solutions were prepared:

40 wt % solution of RP2 in 1-methoxypropan-2-ol 40 wt % solution of PD-140A in 1-methoxypropan-2-ol 8.86 wt % solution of ethyl violet in 1-methoxypropan-2-ol 3 wt % solution of triazine in n-butyl acetate These were combined and coated to give a coating with a dry film composition of:

25 wt % RP2

75wt % PD-140A 0.75% owr triazine 1.5% owr ethyl violet

EXAMPLE 8

A 5 wt % solution of CAHP in 1-methoxypropan-2-ol was prepared.

A coating was prepared by mixing this solution with those described in Example 7 to give a dry film composition of:

25 wt % RP2

75wt % PD-140A 0.75% owr triazine 1.5% owr ethyl violet

2% owr CAHP

EXAMPLE 9

A coating was prepared by mixing the CAHP solution of Example 8 with those described in Example 7 to give a dry film composition of:

25 wt % RP2

75 wt % PD-140A 0.75% owr triazine 1.5% owr ethyl violet

5% owr CAHP

EXAMPLE 10

A coating was prepared by mixing the CAHP solution of Example 8 with those described in Example 7 to give a dry film composition of:

25wt % RP2

75 wt % PD-140A 0.75% owr triazine 1.5% owr ethyl violet

10% owr CAHP

EXAMPLE 11

A coating was prepared by mixing the CAHP solution of Example 8 with those described in Example 7 to give a dry film composition of:

25 wt % RP2

75 wt % PD-140A 0.75% owr triazine 1.5% owr ethyl violet

15% owr CAHP

RESULTS FOR EXAMPLES 7 TO 1

| Example | Operating speed - light units to yield clear 3 STOUFFER step | Fount resistance - degree of attack |
|---|---|---|
| 7 | 171 | No attack on unexposed strip. Slight attack on 10% exposed strip. Severe attack on remaining exposed strips. |
| 8 | 171 | No attack on unexposed, 10% and 20% exposed strips. Some attack on remaining exposed strips. |
| 9 | 150 | No attack on unexposed, 10%, and 20% exposed strips. Some attack on remaining exposed strips. |
| 10 | 135 | No attack on unexposed, 10%, 20% and 30% exposed strips. Slight attack on remaining exposed strips. |
| 11 | 121 | No attack on unexposed, 10%, 20%, 30% and 40% exposed strips. Slight attack on remaining exposed strips. |

CONCLUSIONS ON EXAMPLES 7 TO 11

The higher the CAHP content of the coating the faster the plate speed and the more resistant the coating to attack by the fount solution. Even a small level of CAHP has a significant effect on the fount resistance and improves as the level is increased. In none of the examples was there any significant fount attack in unexposed areas. None of the samples was subjected to significant ambient light levels. Based on the above results and of our experience we would expect samples which had been subjected to significant ambient light levels to undergo some fogging and to have reduced fount resistance in non-imaged regions. The above results further indicate that the presence of the CAHP can be expected to counter this effect and facilitate handling of precursor, prior to imaging.

The following product names given above are or may be trade marks: LB744, DHBP 85%, RP2, MONTAKOP NOVA, GOLDSTAR, STOUFFER, COMBIFIX XL, MATHIS LABDRYER, CAHP.

While the invention has been described in terms of the foregoing specific embodiments, it will be apparent to those skilled in the art that various alterations and modifications may be made to the described embodiments without departing from the scope of the invention, which is limited only by the appended claims. The disclosed embodiments are provided merely by way of example.

What is claimed is:

1. A film-forming composition comprising a carboxylic acid derivative of a cellulosic polymer, and a 1,2,4-naphthoquinone diazide moiety, the composition having the property that when provided as a solid coating on a substrate regions which have been exposed to imaging energy dissolve in an aqueous developer and regions which have not been thus exposed are resistant to dissolution in the aqueous developer and in an organic liquid, wherein the carboxylic acid derivative of the cellulosic polymer provides 0.25–12% of the weight of the composition.

2. A composition as claimed in claim 1, wherein the carboxylic acid derivative of the cellulosic polymer provides 2–12% of the weight of the composition.

3. A composition as claimed in claim 2, wherein the carboxylic acid derivative of the cellulosic polymer provides 5–12% of the weight of the composition.

4. A composition as claimed in claim 3, wherein the carboxylic acid derivative of the cellulosic polymer provides 8–12% of the weight of the composition.

5. A composition as claimed in claim 1, wherein the acid number of the carboxylic acid derivative of the cellulosic polymer is in the range 50–210.

6. A composition as claimed in claim 5, wherein the acid number is in the range 100–180.

7. A composition as claimed in claim 1, wherein said carboxylic acid derivative of a cellulosic polymer is a carboxylic acid derivative of a cellulose acetate.

8. A composition as claimed in claim 7, wherein said carboxylic acid derivative of a cellulosic polymer is a phthalate derivative of a cellulose acetate.

9. A composition as claimed in claim 1, wherein the composition comprises a resin blend having as one component said carboxylic acid derivative of a cellulosic polymer and as a further resin component a material selected from a polymer or copolymer of styrene, a polymer or copolymer of hydroxystyrene, a polymer or copolymer of an alkoxystyrene, a polymer or copolymer of acrylic acid, a polymer or copolymer of methacrylic acid, a polymer or copolymer of acrylonitrile, a polymer or copolymer of acrylamide, a polymer or copolymer of vinyl alcohol, an acrylate polymer or copolymer, a polymer or copolymer of methacrylamide, a sulphonamido or imido polymer or copolymer, a polymer or copolymer of maleiimide or of alkylmaleiimide or of dialkylmaleiimide, a polymer or copolymer of maleic anhydride, a hydroxycellulose or a carboxycellulose.

10. A composition as claimed in claim 1, wherein the composition comprises a resin blend having as one component said carboxylic acid derivative of a cellulosic polymer and as a further resin component polymer having hydroxyl groups.

11. A composition as claimed in claim 10, wherein said second resin component is selected from a phenolic resin and a poly(hydroxystyrene) resin.

12. A composition as claimed in claim 1, wherein the composition contains a polymer which carries diazide moieties as functional groups.

13. A composition as claimed in claim 1, wherein the composition contains a polymer which carries 1,2,4-naphthoquinone diazide moieties as functional groups.

14. A positive working lithographic printing plate precursor or electronic part precursor or mask precursor having a coating on a substrate, the coating comprising a composition as claimed in claim 1.

15. A method of preparing a printing plate or electronic part or mask from a positive working printing plate, electronic part or mask precursor, the printing plate, electronic part or mask precursor comprising
  (a) a substrate; and
  (b) an imagable coating on the substrate, wherein the coating comprises a carboxylic acid derivative of a cellulosic polymer, and a 1,2,4-naphthoquinone diazide moiety, wherein the carboxylic acid derivative of the cellulosic polymer provides 0.25–12% of the weight of the composition; the method comprising the steps of
    (i) exposing the coating imagewise; and
    (ii) removing the exposed portions of the coating using a developer liquid.

16. A film-forming composition comprising a carboxylic acid derivative of a cellulosic polymer, and a 1,2,4-naphthoquinone diazide moiety, the composition having the property that when provided as a solid coating on a substrate regions which have been exposed to imaging energy dissolve in an aqueous developer and regions which have not been thus exposed are resistant to dissolution in the aqueous developer, wherein the carboxylic acid derivative of the cellulosic polymer provides 0.25–12% of the weight of the composition; wherein the composition when provided as a coating on a substrate is more resistant to dissolution in an organic liquid than a corresponding composition not containing a carboxylic acid derivative of a cellulosic polymer.

17. A film-forming composition according to claim 16, wherein the composition when provided as a solid coating on a substrate has a higher operating speed than a corresponding composition not containing a carboxylic acid derivative of a cellulosic polymer.

18. A method of preparing a printing plate or electronic part or mask from a positive working printing plate, electronic part or mask precursor, the printing plate, electronic part or mask precursor comprising
  (a) a substrate; and
  (b) an imagable coating on the substrate, wherein the coating comprises a carboxylic acid derivative of a cellulosic polymer, and a 1,2,4-naphthoquinone diazide moiety, wherein the carboxylic acid derivative of the cellulosic polymer provides 0.25–12% of the weight of the composition; the method comprising the steps of
    (i) exposing the coating imagewise; and
    (ii) removing the exposed portions of the coating using a developer liquid;
      wherein the coating is more resistant to dissolution in an organic liquid than a corresponding composition not containing a carboxylic acid derivative of a cellulosic polymer.

19. A film-forming composition comprising a carboxylic acid derivative of a cellulosic polymer, a 1,2,4-naphthoquinone diazide moiety, and a moiety decomposable by ultraviolet radiation, wherein the carboxylic acid derivative of the cellulosic polymer provides 0.25–12% of the weight of the composition, the composition having the property that when provided as a solid coating on a substrate regions which have been exposed to imaging energy dissolve in an aqueous developer and regions which have not been thus exposed are resistant to dissolution in the aqueous developer and in an organic liquid.

20. A method of preparing a printing plate or electronic part or mask from a positive working printing plate, electronic part or mask precursor, the printing plate, electronic part or mask precursor comprising
 (a) a substrate; and
 (b) an imagable coating on the substrate, wherein the coating comprises a carboxylic acid derivative of a cellulosic polymer, a 1,2,4-naphthoquinone diazide moiety, and a moiety decomposable by ultra-violet radiation, wherein the carboxylic acid derivative of the cellulosic polymer provides 0.25–12% of the weight of the composition; the methods comprising the steps of
 (i) exposing the coating imagewise to ultra-violet radiation; and
 (ii) removing the exposed portions of the coating using a developer liquid.

21. A method of preparing a printing plate or electronic part or mask from a positive working printing plate, electronic part or mask precursor according to claim 20, wherein the exposed portions of the coating are removed using a developer liquid, and wherein the composition when provided as a solid coating on a substrate has a higher operating speed than a corresponding composition not containing a carboxylic acid derivative of a cellulosic polymer.

* * * * *

UNITED STATES PATENT AND TRADEMARK OFFICE
CERTIFICATE OF CORRECTION

PATENT NO. : 6,296,982 B1
DATED : October 2, 2001
INVENTOR(S) : Yates et al.

It is certified that error appears in the above-identified patent and that said Letters Patent is hereby corrected as shown below:

Column 1,
Line 67, "sulphonic" should read -- sulfonic --

Column 3,
Lines 41 and 45, "ie" should read -- i.e., --

Column 4,
Line 34, "is" should read -- n is --

Column 6,
Line 26, insert above the formulae, -- 214 NQD --; and -- 215 NQD --, respectively Column 7,
Line 32, "sulphonamido" should read -- sulfonamido --
Line 33, "maleiimido" should read -- maleimido --
Line 34, "alkylmaleiimide" should read -- alkylmaleimide --; and "dialkylmaleiimide" should read -- dialkylmaleimide --

Column 11,
Line 34, "substrate;and" should read -- substrate; and --

Column 12,
Line 3, "wit" should read -- with --
Line 55, "polymer." should read -- polymer, --

Column 14,
Line 33, "sting." should read -- stirring. --
Line 60, "prioduct" should read -- product --

Column 16,
Line 8, "40% wt%" should read -- 40 wt% --

UNITED STATES PATENT AND TRADEMARK OFFICE
CERTIFICATE OF CORRECTION

PATENT NO. : 6,296,982 B1
DATED : October 2, 2001
INVENTOR(S) : Yates et al.

It is certified that error appears in the above-identified patent and that said Letters Patent is hereby corrected as shown below:

Column 19,
Line 25, "substrate" should read -- substrate, --
Line 62, "sulphonamido" should read -- sulfonamido --
Line 63, "maleiimido" should read -- maleimido --
Line 58, "alkylmaleiimide" should read -- alkylmaleimide --; and "dialkylmaleiimide" should read -- dialkylmaleimide --

Column 21,
Line 7, "substrate" should read -- substrate, --

Signed and Sealed this

Thirtieth Day of April, 2002

*Attest:*

*Attesting Officer*

JAMES E. ROGAN
*Director of the United States Patent and Trademark Office*